United States Patent [19]

Zavracky et al.

[11] Patent Number: 4,890,895
[45] Date of Patent: Jan. 2, 1990

[54] OPTOELECTRONIC INTERCONNECTIONS FOR III-V DEVICES ON SILICON

[75] Inventors: Paul M. Zavracky, Norwood; Matthew M. Zavracky, North Attleboro; John C. C. Fan, Chestnut Hill; Jack P. Salerno, Waban, all of Mass.

[73] Assignee: Kopin Corporation, Taunton, Mass.

[21] Appl. No.: 120,021

[22] Filed: Nov. 13, 1987

[51] Int. Cl.⁴ .............................................. G02B 6/42
[52] U.S. Cl. ................................................ 350/96.20
[58] Field of Search ............... 350/96.11, 96.12, 96.13, 350/96.14, 96.15, 96.16, 96.17, 96.20, 96.21, 96.22; 357/17, 19, 30, 74

[56] References Cited

U.S. PATENT DOCUMENTS

| | | | |
|---|---|---|---|
| 4,273,445 | 6/1981 | Thompson et al. | 356/350 |
| 4,466,696 | 8/1984 | Carney | 350/96.20 |
| 4,561,916 | 12/1985 | Akiyama et al. | 148/175 |
| 4,639,074 | 1/1987 | Murphy | 350/96.15 |
| 4,657,341 | 4/1987 | Sammueller | 350/96.22 |
| 4,750,799 | 6/1988 | Kawachi et al. | 350/96.11 |
| 4,759,595 | 7/1988 | Boord et al. | 350/96.13 |
| 4,762,382 | 8/1988 | Husain et al. | 350/96.12 |
| 4,762,387 | 8/1988 | Batdorf et al. | 350/96.20 |
| 4,767,174 | 8/1988 | Carenco et al. | 350/96.20 |

OTHER PUBLICATIONS

Hutcheson, ed. *Optical Interconnections* Optical Engineering, 25(10): 1075-1141.
Goodman, et al., *Optical Interconnections for VLSI*, Proceedings of the IEEE, 72 (7):850-866 (Jul. 1984).
Fisher, et al., *Monolithic Integration of GaAs/AlGaAs Modulation-Doped Field-Effect Transistors and N-Metal-Oxide-Semiconductor Silicon Circuits*, Applied Physics Letters, 47(9):983-985 (Nov. '85).
Hutcheson, et al., *Optical Interconnects Replace Hardwire*, IEEE Spectrum, 30-35 (Mar. 1987).

Primary Examiner—Frank Gonzalez
Attorney, Agent, or Firm—Hamilton, Brook, Smith & Reynolds

[57] ABSTRACT

An optical device formed on an Si substrate comprising: a III-V optical transmitter formed on the Si substrate, a silicon device formed in or on, the Si substrate and an alignment groove formed in the substrate for aligning an optical fiber with said transmitter.

4 Claims, 5 Drawing Sheets

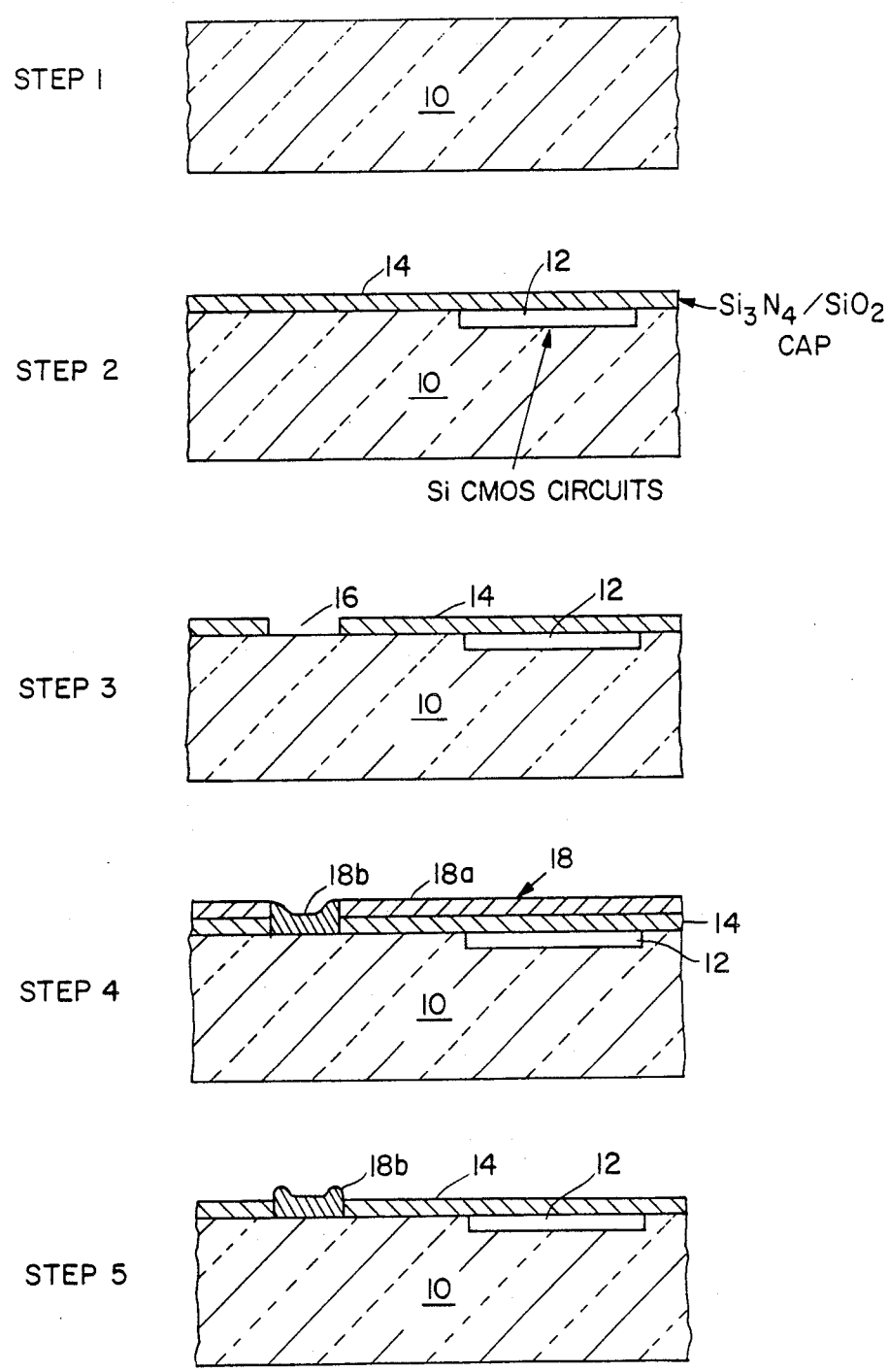
Fig. 1 SHEET 1

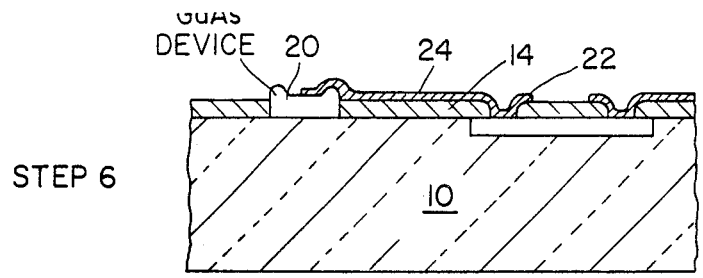
STEP 6
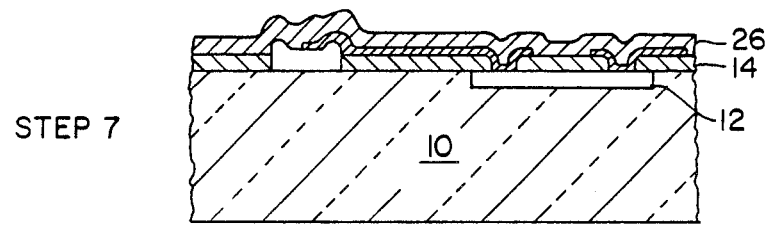
STEP 7
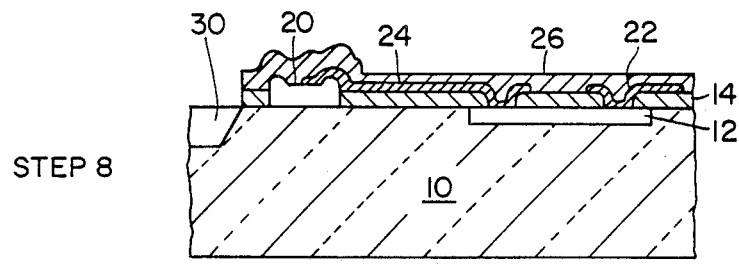
STEP 8
*Fig. 1* SHEET 2

OPTOELECTRONIC INTERCONNECTIONS FOR III-V DEVICES ON SILICON

BACKGROUND OF THE INVENTION

RELATED U.S. APPLICATIONS

Selective OMCVD Growth of Compound Semi Conductor Materials on Silicon Substances by Jack P. Salerno, Jherry Woo Lee and Richard E. McCullough, U.S. Patent No. 4,826,784.

The demands on communications systems are increasing at a tremendous rate. Reliable data transfer at the rates required for applications such as signal processing necessitate the use of optical communications. As these systems become sufficiently complex, the use of optoelectronic integrated circuits (OEIC) is becoming increasingly attractive for cost and performance reasons. In the last several years, significant efforts have been made toward the monolithic integration of devices formed of III–V compounds and alloys thereof and in particular GaAs electronic and GaAs/GaAlAs optical devices on GaAs wafers. These efforts to date have been successful from the standpoint of preliminary concept demonstration but have been limited by the immaturity of GaAs electronic device technology and the quality of the GaAs material itself. Recent progress in obtaining high-quality GaAs on Si substrates offers the potential to overcome these obstacles. The key advantage of GaAs on Si for integrated optoelectronic components is that the electronic circuits can be fabricated in Si wafers. The design and fabrication technology of Si circuits is well developed and the economics of such circuits are also very attractive. This approach to monolithic GaAs and Si integration will complement Si circuits with GaAs/GaAlAs optical components.

The essence of monolithic integration technology is not only the ability to grow high-quality GaAs on Si substrates but also the ability to fabricate GaAs and Si devices together on a single chip. The ability to grow high quality GaAs layers on Si substrates has been demonstrated by several groups. The fabrication of GaAs and Si devices together on one chip has also been demonstrated.

Full monolithic integration of interconnected GaAs/GaAlAs double heterostructure LEDs and Si MOSFETs has also been demonstrated (see copending U.S. patent application Ser. No. 874,295 now U.S. Pat. No. 4,774,205 incorporated herein by reference). The Si MOSFETs, with a gate length of 5 um and a gate width of 1.6 um, have essentially the same characteristics as those of control Si MOSFETs fabricated on a separate Si wafer. An LED modulation rate of 27 Mbit/sec, limited mainly by the speed of the Si MOSFET, has been demonstrated by applying a stream of voltage pulses to the MOSFET gate.

While their performance is good, optoelectronic devices fabricated on GaAs on Si, including solar cells, LEDs, and diode lasers, have not yet reached the quality of those fabricated using GaAs substrates. As the material quality of GaAs on Si improves to where defect densities are lower than $10^5$ cm$^{-2}$, the performance of LEDs should be similar to LEDs on GaAs substrates. The performance of lasers will also be similar when the dislocation densities reach $10^3$ to $10^4$ cm$^{-2}$.

SUMMARY OF THE INVENTION

The invention comprises a system for optoelectronically interconnecting GaAs devices or other III-V or II-VI devices grown on silicon substrates. The ability to etch Si into selected geometries is used to provide alignment structures in a silicon substrate. A groove is made adjacent to a light emitting device or light detecting optical device and serves to hold and align an optical fiber in alignment with the emitted light beam while a well is defined adjacent to a light detecting device for an equivalent purpose.

This basic structure serves as a building block for a family of interconnect devices, such as receivers, transmitters, transceivers, multiplexers and connecters.

DESCRIPTION OF THE DRAWINGS

FIG. 1 is a process flow description of the invention.

DISCLOSURE OF THE INVENTION

Figure 2:
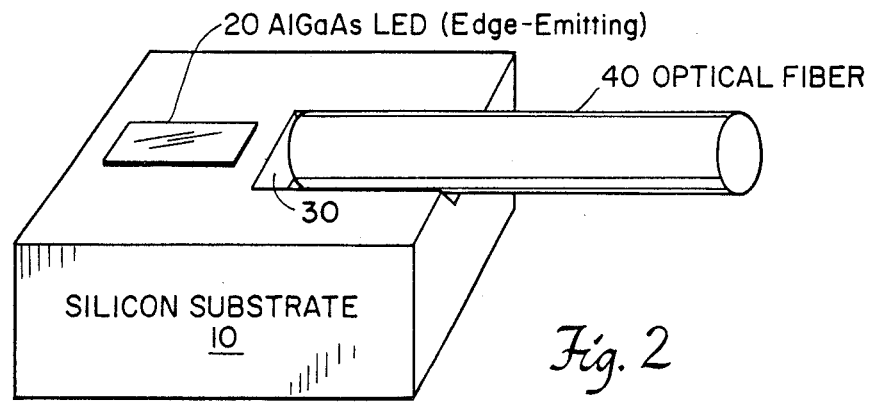
FIG. 2 is a schematic prospective illustration of the transmitter of the invention.

Referring now to FIG. 1 the process of forming an electrical interconnect between a silicon circuit on a Si substrate with a GaAs edge emitting light source diode on the same circuit along with an optical connection to said diode will now be disclosed.

In step 1 a single crystal Si wafer 10 is provided. A silicon circuit 12, such as TTL or CMOS, is formed in a volume of the wafer and a Si$_3$N$_4$/SiO$_2$ cap 14 formed over the wafer (step 2). A window 16 is opened in the cap layer (step 3). Capped Si surface may be either recessed or not recessed. The GaAs may be grown over the entire wafer by organometallic chemical vapor deposition (OMCVD) or molecular beam epitaxy (MBE) as shown in step 4, in which case the growth 18b in the opening is epitaxial; whereas outside the growth 18a is polycrystalline. Alternatively, as disclosed in copending U.S. patent application to Jack P. Salerno et al. filed this date now U.S. Ser. No. 120,018, and incorporated herein by reference, GaAs may be formed selectively on the Si. To remove the poly GaAs, the crystalline GaAs is masked and the poly GaAs etched away (step 5).

GaAs devices 20 such as LED's etc. are then formed in the known manner on, or in, the GaAs crystal 18b and contact metallization and interconnects made between devices.

Assuming device 20 is an edge emitting LED, a second cap layer 26 of Si$_3$N$_4$ or SiO$_2$ or both is deposited over the structure (step 7). The layer is then photolithographically patterned to define an area on the Si surface adjacent the edge of the LED 20 and centered on the light beam from the active LED strip or cavity. The exposed silicon 10 is then anisotropically etched away to define an alignment groove 30 for further positioning (step 8). The wafer is diced and bonded to a package. Electrical leads are wire bonded in the usual way, and optical fibers 40 are placed in the groove 30 and bonded as appropriate (see FIG. 2).

Figure 3:
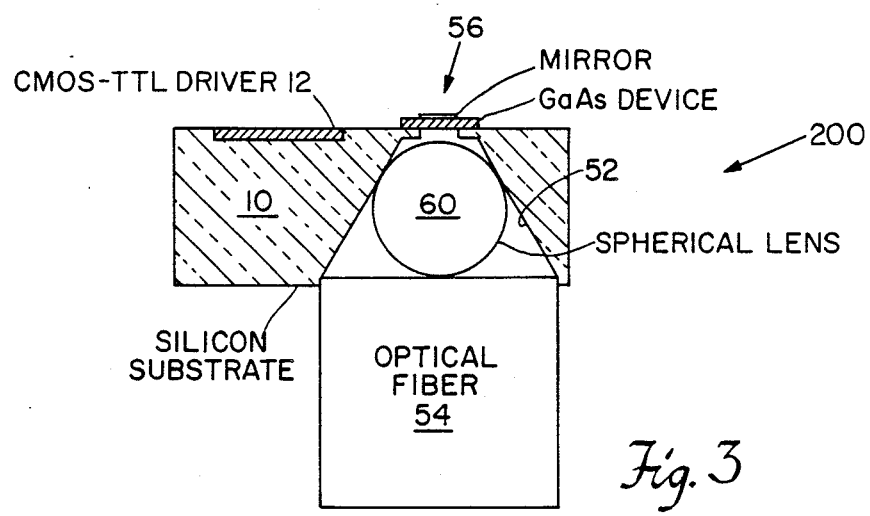
FIG. 3 is a schematic sectional view of a surface emitting transmitter or planar detector of the invention.

Clearly, multiple circuits and multiple wells or grooves for II-IV devices along with multiple Si circuits may be formed on a single wafer. FIG. 3 is a schematic representation of an optical transceiver chip 200. A silicon wafer 10 is first prepared with the appropriate CMOS or TTL circuitry 12 and then capped with a layer of $Si_3N_4/SiO_2$. As previously recited, windows are cut in the cap layer to expose areas of silicon in which the GaAs is to be grown. GaAs is then grown on the entire Si wafer in an OMCVD or MBE reactor, but is only single crystal in the window areas and is polycrystalline everywhere else. Additional GaAs/AlGaAs layers are grown to complete the GaAs device structures. The polycrystaline GaAs is then etched away. Note that the anisotropic etching of the silicon wafer 10 creates pyramidal grooves 30 in the silicon substrates which can subsequently be used for alignment of fibers or spherical lenses 60 coupled to the GaAs devices 20. Interconnection between the GaAs devices and the silicon devices is then made using standard thin film and photolithographic techniques.

Typically, the alignment between the LED's or the detectors and optical fibers is critical. With GaAs on Si technology; problems associated with fiber alignment are greatly reduced. This is because one can take advantage of the well-developed anisotropic etch characteristics of silicon. Fiber alignment channels 52 can be etched into the silicon substrate so as to provide a guide for the placement of optical fibers. These would then be placed in precise alignment with edge emitting LEDs or LASERs.

Fiber alignment may be achieve in two similar ways. The first as noted above is with an anisotropically etched channel that lies in the plane of the LED. In this case edge emitting LEDs are used. A second approach which is shown in FIG. 3; is to back etch the silicon 10 anisotropicaly to create a pyramidal channel 52 which is then used to align a fiber 54 vertically to the surface of the chip. In this case, surface emitting LEDs 56 can be used. (See Choi et al. supra for a description of how surface emitting GaAs LED can be fabricated on Si substrates). Edge emitting LEDs have the advantage of coupling more efficiently to the fiber and probably do not require the use of a lens, whereas the coupling of surface emitting LEDs would be improved using a spherical lens 60 as shown in FIG. 3. Detectors on the other hand, almost certainly require a vertical alignment of the fiber. With GaAs on silicon it is easy to achieve both vertical and horizontal fiber alignment on a single chip.

Figure 4A:
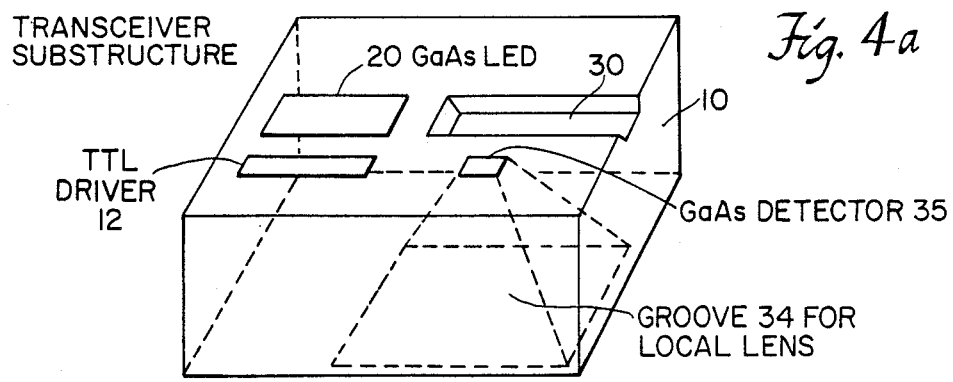
FIG. 4a is a schematic prospective of a transceiver substructure in accordance with the invention.
Figure 4B:
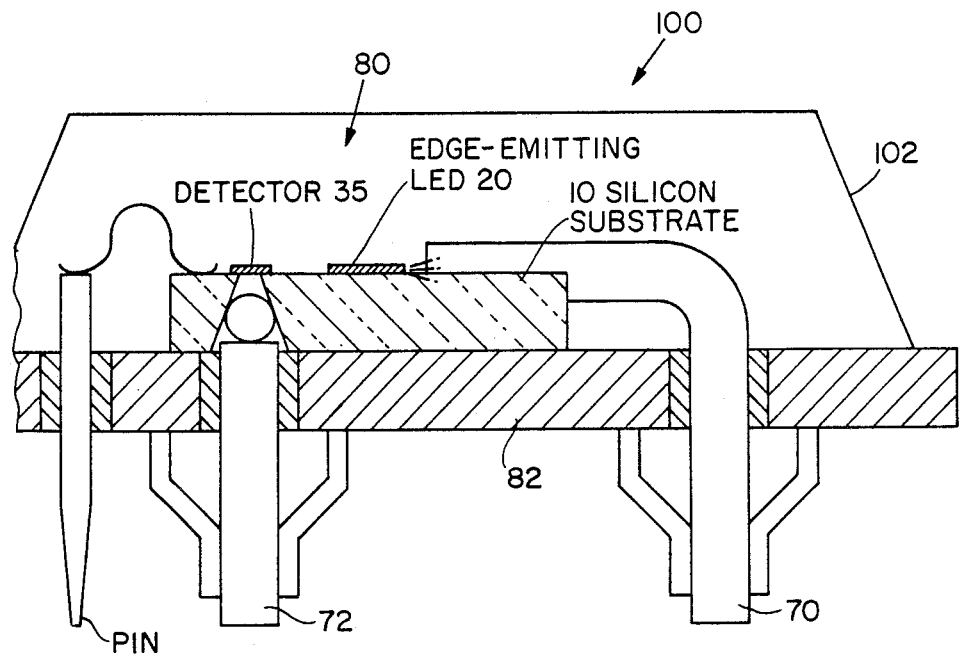
FIG. 4b shows the transceiver as packaged with connecting optical fibers.

The packaging technology for electro-optical devices has been expanding over the last few years. Connectors are now readily available in standard configurations. In order to take full advantage of GaAs on Si technology, optical transceivers 100 as in FIG. 4b could be placed in packages 102 which are designed to mate with fiber optic connectors 70, 72. FIG. 4a shows a fabricated GaAs on Si monolithic transceiver structure where the GaAs edge emitting LED or LASER 20 will be coupled to an optical fiber 70 lying in the adjacent groove. A planar GaAs detector 35 is fabricated in a laterally adjacent position. A well geometry groove 34 is fabricated by anisotrophy etching the Si substrate 10 directly below the planar detector 35 for optical fiber alignment to the detector. FIG. 4b shows the packaging methodology for this transceiver structure; in particular the optical fiber connection technique. In FIG. 4 an intermediate fiber 70 is used between the optical transceiver chip 80 and the package ferrule 82. The completed 'short-fiber structure' then either becomes the connector or is inserted into the connector. Two connectors would be associated with each optical transceiver package.

The optical transceiver is a combination package consisting of a fiber optic receiver and a fiber optic transmitter. It is achieved through the integration of silicon electrical circuitry with GaAs/AlGaAs structures on a single monolithic chip. It may be used for digital data transmission over single fibers. A bipolar integrated circuit and a high efficiency AlGaAs LED may be used to convert TTL level inputs to optical pulses and optical inputs to TTL outputs at data rates exceeding 10 Mbaud. The transceiver 100 may be supplied in a standard dual-in-line package which is modified to support two mini-bnc or similar type fiber optic connectors. A family of optical transceivers can be created each with a specific application area. At the most elementary level, the transceiver would simply take TTL signals and convert them to light pulses leaving signal conditioning problems in the hands of the user. A slightly more complicated transceiver would take a TTL data stream and convert it to a NRZ (non-return to zero) code before optical transmission and back from NRZ to TTL levels at reception. Ultimately, a device that could replace the backplane of a computer system is possible. This device would use a silicon bipolar circuit to condition the data and address busses and the control signals for acceptance by a high speed GaAs digital circuit. The GaAs electronics would perform a function similar to that of a Universal Asynchronous Receiver Transmitter (UART) taking parallel data and converting it to a serial data stream. Again, an LED or LASER would be used to send light pulses down the fiber. Optical serial data received from a fiber would be converted back to a parallel form. This device would necessarily be transparent to the user in the sense that the user would not have to change in a fundamental way his approach to systems problems. The user would have at his disposal an alternative way of approaching a backplane that would free him from the need to interconnect large numbers of wires between system components and all the problems that are associated with conventional backplanes.

Several advantages can be achieved when fiber optic interconnections are used in place of electrical leads. Electrostatic and electromagnetic interference are virtually eliminated. Fibers can be placed in close proximity to one another without one interference. Fibers are much more immune to harsh environments than are electrical leads.

A very important advantage is obtained using GaAs on Si technology in this application. Typically the alignment of the fiber with a surface emitting LED is done by moving the fiber over the LED while monitoring the output intensity. When a maximum intensity is achieved, the fiber is rigidly and permanently reunited using an adhesive. Improvements in coupling efficiency can be achieved by interjecting a spherical lens between the fiber and the LED. In this case, the lens must be placed in its optimum position using a similar technique as that just described. With GaAs on Si, the LED can be prealigned to a specifically located etched channel in the silicon substrate. This etched channel is then used to align the fiber or the lens or both to the LED or to a detector. The fiber is then mounted in its pre-aligned position on the monolithic chip using an adhesive. Thus the manufacturability of fiber optic transceivers employing monolithic GaAs on Si technology is greatly improved.

It should be noted that the devices herein described may include, optical transmitters comprising a GaAs light emitter and a groove with fiber on Si with or without associated Si circuitry. Similarly an optical receiver may comprise a GaAs detector with, or without associated Si circuitry. In large scale electronic systems such as found in the military, spacecraft, mainframe computer systems, industrial control, etc., a classic problem persists. In order to transfer the large amount of information being processed cables consisting of many wires have long been the only solution. The more wires in parallel the higher the performance of the link (total bit rate per second). The use of the optoelectronic family would reduce these cables down to a few thin optic fibers.

Figure 5:
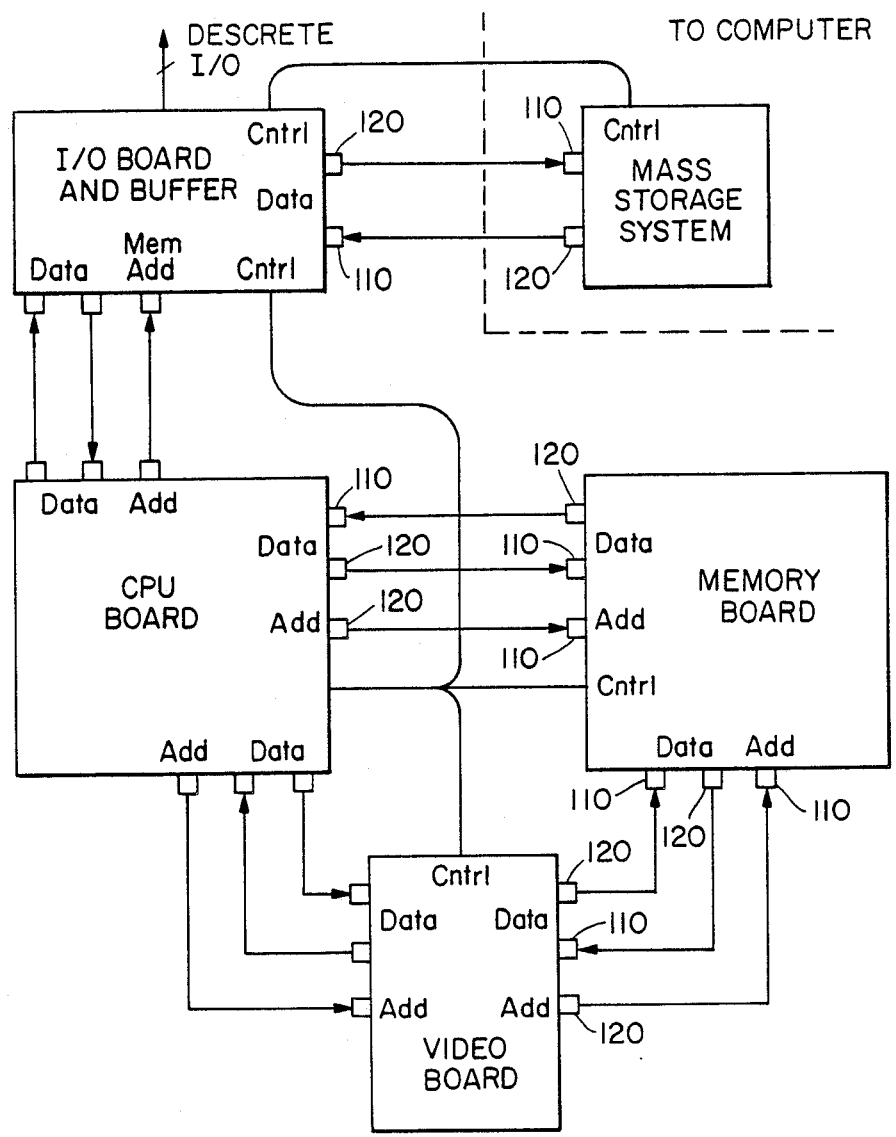
FIG. 5 shows receivers and transmitter of the invention in a computation application.

FIG. 5 is a standard computer system layout showing how the optoelectronic receivers 110 and transmitters 120 described herein can be used for interconnection. This layout is valid for the description of a PC, multiboard system and a multicabinet system. The invention will find application in multiboard systems, multicabinet systems and plan applications. The product can be used just as the analogous TTL line and communication type chips. For straight communication type problems a standard chip would be used like an RS232 chip except the wires would be fibers. The communication chip would have a high speed GaAs receiver/transmitter circuit coupled with a silicon MSI LSI circuit that would perform protocol and interface functions.

For custom applications the standard chip set as described earlier would be mixed and matched to achieve the desired functionality just the same as one would with TTL.

Equivalents

While the above described embodiments of the invention are preferred, other configurations will be readily apparent to those skilled in the art and thus the invention is only to be limited in scope by the language of the following claims and equivalents.

For example, while the III–V devices have been described using GaAs as an example other II–V elements may be substituted therefor, as well as alloys thereof.

We claim:

1. An integrated GaAs light emitting structure and light detection structure including a Si semiconductor substrate with epitaxial layers deposited thereon in which one of the epitaxial layers is an active light emitting GaAs layer extending in a longitudinal direction, the light being emitted through an edge of said layer and another layer comprises a light detecting layer for detecting externally generated light; the improvement comprising:
   (a) an optical fiber coupled to said light from said edge for transmitting light from said light emitting layer;
   (b) an area of the Si semiconductor substrate extending beyond the edge; and,
      (i) an etched groove in the surface of aid area of extended Si substrate and extending in said longitudinal direction and centered in line with the edge, said groove being of a depth compatible with the diameter of said optical fiber so that when such fiber is positioned in said groove, the core of said fiber is at the same elevation as said edge,
      (ii) a silicon amplifier device formed on said extended Si substrate,
      (iii) a GaAs light detector formed on said extended Si substrate and electrically coupled to said silicon device such that externally generated light is detected by said GaAs detector and converted to electrical signals and coupled to said silicon device and amplified.

2. A monolithic integrated optoelectronic device formed of active silicon components and active GaAs components comprising:
   (a) a silicon substrate having first and second opposed planar surfaces;
   (b) epitaxial layers formed on the first surface of said substrate with one layer being the active light emitting layer of a GaAs surface light emitting component which emits light from a first surface of the GaAs in a direction orthogonal to the substrate surface;
   (c) a groove formed through the second surface of said substrate to expose a second surface of said GaAs component opposite the first surface of said GaAs component;
   (d) a mirror formed on the first surface of the GaAs component to reflect emitted light back through said GaAs component;
   (e) a lens formed in said groove to collimate light reflected back through said GaAs component;
   (f) an optical fiber coupled to said lens for guiding the light.

3. The device of claim 2 including a silicon integrated circuit device integrally formed on said substrate adjacent said GaAs component and electrically coupled thereto.

4. The device of claim 3 wherein the silicon circuit is a driver circuit.

* * * * *